(12) United States Patent
Cong et al.

(10) Patent No.: US 9,461,649 B2
(45) Date of Patent: Oct. 4, 2016

(54) PROGRAMMABLE LOGIC CIRCUIT ARCHITECTURE USING RESISTIVE MEMORY ELEMENTS

(71) Applicant: The Regents of the University of California, Oakland, CA (US)

(72) Inventors: Jingsheng J. Cong, Los Angeles, CA (US); Bingjun Xiao, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 79 days.

(21) Appl. No.: 14/404,874

(22) PCT Filed: Jun. 3, 2013

(86) PCT No.: PCT/US2013/043923
§ 371 (c)(1),
(2) Date: Dec. 1, 2014

(87) PCT Pub. No.: WO2013/181664
PCT Pub. Date: Dec. 5, 2013

(65) Prior Publication Data
US 2015/0123706 A1 May 7, 2015

Related U.S. Application Data

(60) Provisional application No. 61/654,542, filed on Jun. 1, 2012.

(51) Int. Cl.
*H03K 19/177* (2006.01)
*H03K 19/173* (2006.01)
*G11C 13/00* (2006.01)
(Continued)

(52) U.S. Cl.
CPC ............ *H03K 19/1776* (2013.01); *G11C 5/06* (2013.01); *G11C 13/0002* (2013.01); *H01L 45/16* (2013.01); *H03K 19/1736* (2013.01); *H03K 19/17736* (2013.01)

(58) Field of Classification Search
None
See application file for complete search history.

(56) References Cited

U.S. PATENT DOCUMENTS 5,646,545 A * 7/1997 Trimberger ......... G06F 15/7867
326/38
7,511,532 B2 3/2009 Derharcobian et al.
8,159,266 B1 * 4/2012 Madurawe .......... H01L 27/0207
326/101

(Continued)

OTHER PUBLICATIONS

PCT International Search Report and Written Opinion dated Aug. 27, 2013 for PCT Application No. PCT/US2013/043923.
Cong, J., et al., "mrFPGA: A Novel FPGA Architecture with Memristor-Based Reconfiguration", In: NANOARCH 2011 Proceedings of the 2011 IEEE/ACM International Symposium on Nanoscale Architecture, IEEE Computer Society, Washington DC, USA, Jun. 8-9, 2011, pp. 1-8.

(Continued)

*Primary Examiner* — Crystal L Hammond
(74) *Attorney, Agent, or Firm* — Gates & Cooper LLP (57) ABSTRACT

A programmable logic circuit architecture using resistive memory elements. The proposed circuit architecture uses the conventional island-based Field Programmable Gate Array (FPGA) architecture, but with novel integration of CMOS-compatible resistive memory elements that can be programmed efficiently. In the proposed architecture, the programmable interconnects of FPGA are redesigned to use only resistive memory elements and metal wires. Then, the interconnects can be entirely fabricated over logic blocks to save area while keeping their architectural functions unchanged, and the programming transistors can be shared among resistive memory elements to save area. Finally, on-demand buffer insertion is proposed as the buffering solution to achieve more speedup.

16 Claims, 9 Drawing Sheets

(51) Int. Cl.
    *G11C 5/06* (2006.01)
    *H01L 45/00* (2006.01)

(56) References Cited

U.S. PATENT DOCUMENTS

| | | | |
|---|---|---|---|
| 2005/0035783 A1 | 2/2005 | Wang | |
| 2005/0162933 A1* | 7/2005 | Madurawe | H03K 19/17704 365/189.05 |
| 2006/0279328 A1 | 12/2006 | Kozicki et al. | |
| 2007/0210826 A1* | 9/2007 | Madurawe | H03K 19/17796 326/38 |
| 2009/0128189 A1* | 5/2009 | Madurawe | H03K 19/17796 326/41 |
| 2010/0038625 A1* | 2/2010 | Bertin | B82Y 10/00 257/9 |
| 2012/0119782 A1* | 5/2012 | Madurawe | H03K 19/17736 326/47 |
| 2012/0193681 A1* | 8/2012 | Or-Bach | H03K 19/17736 257/208 |

OTHER PUBLICATIONS

Liu, M., et al., "Application of nanojunction-based RRAM to reconfigurable IC", Micro & Nano Letters, IET, Sep. 2008, vol. 3, pp. 101-105.

Liauw, Y.Y., et al., "Nonvolatile 3D-FPGA with Monolithically Stacked RRAM-Based Configuration Memory", Solid-State Circuits Conference Digest of Technical Papers (ISSCC), 2012 IEEE, Feb. 19-23, 2013, pp. 406-408.

Snider, G., et al., "Nano/CMOS architectures using a field-programmable nanowire interconnect", Nanotechnology, Jan. 24, 2007, 035204, pp. 1-11, vol. 18, No. 3.

Dobbelaere, I., et al., "Regenerative Feedback Repeaters for Programmable Interconnections", IEEE Journal of Solid-State Circuits, Nov. 1995, pp. 1246-1253, vol. 30, No. 11.

Tsunoda, K., et al., "Low Power and High Speed Switching of Ti-doped NiO ReRAM under the Unipolar Voltage Source of less than 3 V", IEDM Technical Digest, Dec. 2007, pp. 767-770.

* cited by examiner

PROGRAMMABLE LOGIC CIRCUIT ARCHITECTURE USING RESISTIVE MEMORY ELEMENTS

CROSS REFERENCE TO RELATED APPLICATION

This application claims the benefit under 35 U.S.C. Section 119(e) of commonly-assigned U.S. Provisional Patent Application Ser. No. 61/654,542, filed on Jun. 1, 2012, by Jingsheng J. Cong and Bingjun Xiao, entitled "PROGRAMMABLE LOGIC CIRCUIT ARCHITECTURE USING RESISTIVE MEMORY ELEMENTS," which application is incorporated by reference herein.

BACKGROUND OF THE INVENTION

1. Field of the Invention

This invention is related to programmable logic circuits, and more specifically, to a programmable logic circuit architecture using resistive memory elements.

2. Description of the Related Art (Note: This application references a number of different publications as indicated throughout the specification by one or more reference numbers within brackets, e.g., [x]. A list of these different publications ordered according to these reference numbers can be found below in the section entitled "References." (Each of these publications is incorporated by reference herein.)

Figure 1:
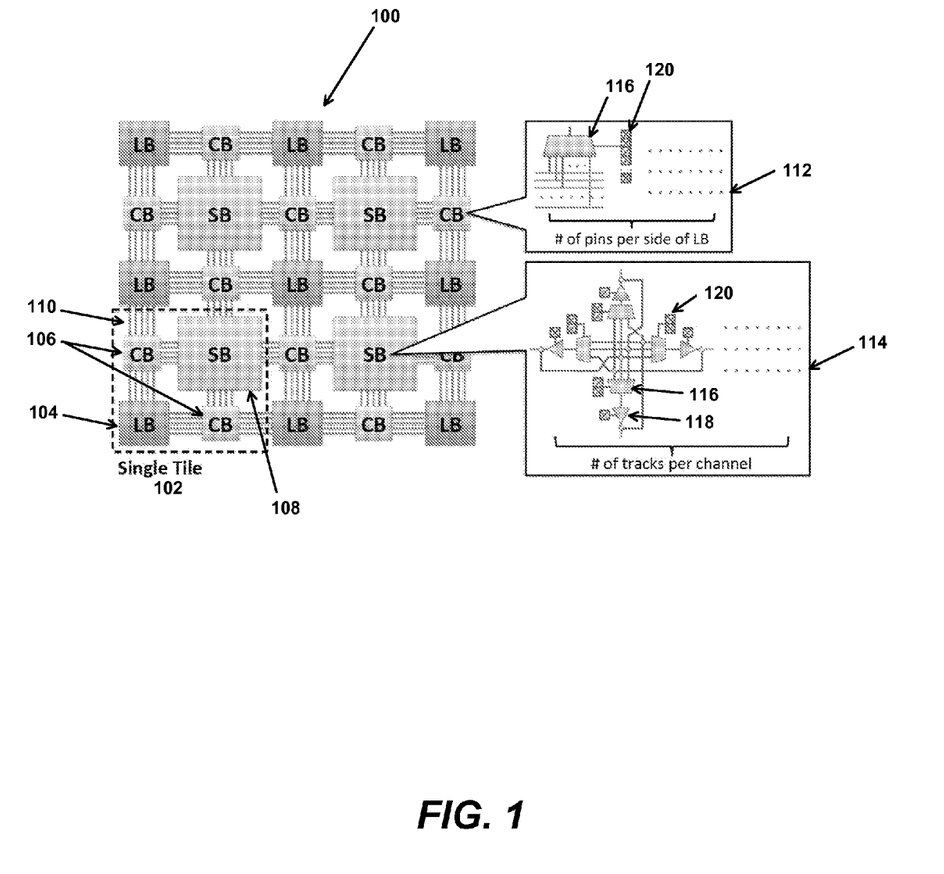
FIG. 1 shows a state-of-art island-based FPGA architecture with segmented channels.

A Field Programmable Gate Array (FPGA) is a representative programmable logic circuit. FIG. 1 shows the state-of-art island-based FPGA architecture with segmented channels, wherein an FPGA 100 is comprised of an array of tiles 102, and each tile 102 consists of one logic block (LB) 104, two connection blocks (CB) 106, and one switch block (SB) 108. Each LB 104 contains a cluster of basic logic elements, typically look-up tables (LUTs), to provide customizable logic functions. The LBs 104 are connected to segmented routing channels 110 through the CBs 106, and the segmented routing channels 110 are connected with each other through SBs 108.

Callout blocks 112 and 114 depict two typical circuit designs for CBs 106 and SBs 108, respectively, based on multiplexers (MUXs) 116 and buffers 118. The selector pins of each multiplexer 116 are connected to a group of static random access memory (SRAM) cells 120 that control and program its connectivity. The circuits in FIG. 1 have copies of up to the number of pins per side of LBs 104 in a single CB 106, and up to the number of tracks per channel in a single SB 108.

In existing FPGAs, CBs and SBs make up the interconnects of FPGAs with much larger area and higher complexity as compared to the direct interconnects of an Application Specific Integrate Circuit (ASIC). Actually, the programmable interconnects are the dominant part of an FPGA. As shown in the two circuit designs 112, 114 in FIG. 1, the circuit components of programmable interconnects include MUX-based routing switches 116, routing buffers 118, and SRAM cells 120. All of them are non-trivial, but have fundamental weak points.

The MUX-based routing switches 116 have high serial resistance and need large transistor width (and hence large area) to overcome it. The routing buffers 118 are extensively fabricated and used due to their fixed locations in programmable interconnects which cannot be optimized according to design demand. The storage overhead of SRAM cells 120 is as high as six transistors per bit.

Some literature [1] proposes to improve FPGA architecture using non-volatile memory elements. Consider, for example, FIGS. 7 and 18 of [1], wherein the SRAM-based pass transistors in MUXs in FPGAs as shown in FIG. 7 of [1] are replaced with non-volatile resistive memory elements as shown in FIG. 18 of [1]. However, this direct replacement leads to high overhead of programming circuits for resistive memory elements, which undermines the benefit brought by the replacement. Also, the method in [1] does not solve the problem of extensive fabrication of routing buffers.

Figure 2A:
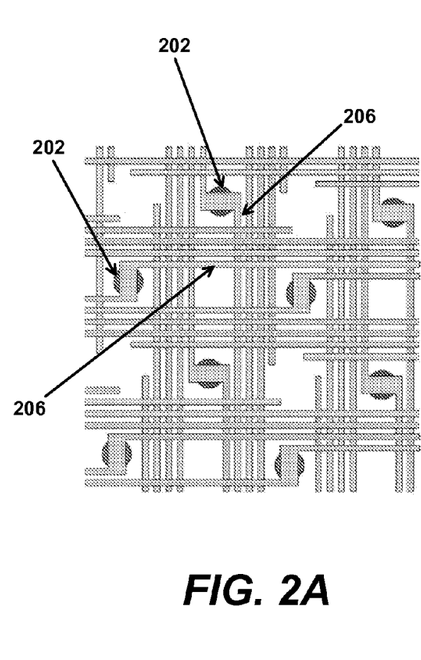
FIGS. 2A and 2B illustrate programmable interconnects using nanowire crossbars.
Figure 2B:
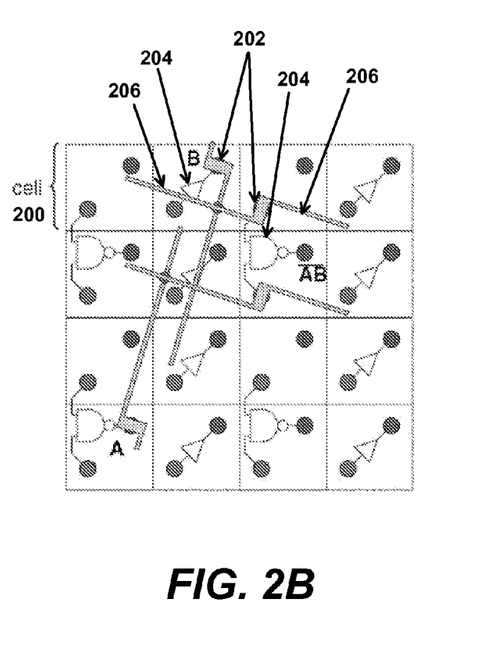

Other literature [2] proposes to provide programmable interconnects using nanowire crossbars, as shown in FIG. 2 of [2]. FIGS. 2A and 2B illustrate cells 200 with output and/or input pads 202 of logic gates 204 that may be interconnected using nanowire crossbars 206. This prior art also replaces LUTs in FPGA with simple logic gates. The connections between nanowires are determined by reconfigurable junctions between two nanowire layers. The method in [2] leads to speed degradation and high power consumption due to large capacitance of nanowires.

Nonetheless, what is needed is a redesign of programmable interconnects of FPGA in light of the technology development of resistive memory elements. The present invention satisfies this need.

SUMMARY OF THE INVENTION

To overcome the limitations in prior art, and to overcome other limitations that will become apparent upon reading and understanding the present specification, the present invention discloses a new programmable logic circuit architecture using resistive memory elements.

The proposed circuit architecture starts from the conventional island-based FPGA architecture with all routing buffers removed. By using resistive memory elements as programmable switches, the programmable interconnects of an FPGA are built up from only resistive memory elements and metal wires, but without any complementary metal-oxide-semiconductor (CMOS) transistors. Then, with utilization of back-end-of-line (BEOL) compatible fabrication of resistive memory elements, the interconnects can be entirely fabricated over CMOS-based logic blocks to save area while keeping their architectural functions unchanged.

A programming schematic is also provided for resistive memory elements integrated in programmable interconnects. Based on the CMOS-free interconnect structure, the programming schematic is able to provide programming transistor sharing between resistive memory elements.

In addition, on-demand buffer insertion is proposed as the buffering solution of the proposed programmable interconnects. Compared to the fixed buffer pattern in most programmable logic circuits, the positions of inserted buffers in the proposed architecture are optimized according to the demands of the design to be implemented in the FPGA.

The proposed architecture is applicable for FPGAs with integration of any type of BEOL-compatible resistive memory elements, such as Phase Change Memory, Carbon Nanotube Memory, Nanoelectromechanical Relays, Reduction/Oxidation Memory, Electronic Effects Memory or Molecular Memory.

Further introduction of three-dimensional (3D) technologies provides more improvement.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention redesigns FPGA programmable interconnects based on resistive memory elements, known as resistive random access memory (RRAM) or memristors.

Compared to [1], this invention has the following advantages:

1. This invention better fits the fabrication structure of resistive memory elements. The integration of SRAM cells in programmable interconnects were optimized for conventional FPGAs. One SRAM cell usually involves a CMOS layer and multiple metal layers. In contrast, a resistive memory element does not involve a CMOS layer and, in most cases, can be integrated in a single layer between two metal layers. Situ replacement of SRAM cells with resistive memory elements, as proposed in [1], may not fully benefit from the advantages of resistive memory elements. In this invention, however, with the redesign of the routing structure, all resistive memory elements are arranged in the same layer without loss of the full programmability of the interconnects. Being free of multiple layers of resistive memory elements avoids additional cost and design challenges. Also, in the basic architecture of this invention, no transistors are included in the programmable interconnects, so the interconnects can be entirely placed over logic blocks and the FPGA area can be reduced to that of logic blocks only, which was a small portion in conventional FPGAs.

2. This invention reduces the number of the programming transistors for resistive memory elements significantly. In the programming scheme of [1], one resistive memory element needs two programming transistors. But, in this invention, this number is reduced to ⅙ of the cost since the redesigned routing network facilitates the sharing of the programming transistors between resistive memory elements and even between tiles.

Compared to [2], this invention has the following advantages:

1. This invention still uses standard metal wires for interconnects instead of nanowires. This avoids the problems brought by the immaturity of the emerging technology to fabricate nanowires, e.g. the problem of broken nanowires. The only emerging technology needed by this invention is the fabrication of resistive memory elements, which has been demonstrated in many device papers, e.g., [3]. The redesigned routing network also follows the topology of the fabrication structure of resistive memory elements, metal wires and logic gates, so that the risk of the manufacturing process could be minimized.

2. This invention keeps standard programmable logic blocks as used in conventional FPGAs, instead of fine-grain logic gates (AND/NAND gates) in [2]. This avoids an increase in demand for programmable interconnect resources to provide a similar routability for the logic blocks. This also avoids an increase in logic levels for synthesis results and a corresponding increase in circuit delay.

3. This invention adopts the typical island-based architecture with the concept of connection blocks and switch blocks like conventional FPGAs, instead of the nanowire crossbars proposed in [2]. The structure of connection blocks and switch blocks with resistive memory elements in this invention avoids the large capacitance load suffered by the long nanowires in [2].

In addition, this invention also has the following advantages compared to the existing art on programmable logic circuits:

1. A novel on-demand buffer insertion capability is introduced with the simplified connections of resistive memory elements. It alleviates the over-fabrication and over-use of buffers in conventional FPGAs and leads to better performance with lower power consumption.

2. 3D stacking can be further applied to this invention to achieve more improvement of area savings, speed up and power efficiency.

Technical Description

The present invention keeps the state-of-art island-based FPGA architecture with segmented channels. The contribution is that it redesigns the programmable interconnects in the island-based architecture using resistive memory elements to achieve a significant reduction of area, delay and power. The resistive memory elements used herein refer to CMOS-compatible resistive memory elements, which can be fabricated over transistors, e.g. the device presented in [3]. It is the only emerging technology required by this invention.

As implied by the name "resistive memory elements," the resistance values between two certain terminals of them can be programmed between a high resistance state and a low resistance state. These kinds of resistive memory elements include Phase Change Memory, Carbon Nanotube Memory, Nanoelectromechanical Relays, Reduction/Oxidation Memory, Electronic Effects Memory or Molecular Memory. With utilization of BEOL-compatible fabrication of the resistive memory elements, the programmable interconnects of FPGA in this invention are placed over the transistor layer in the same die, just like ASIC interconnects.

Figure 3:
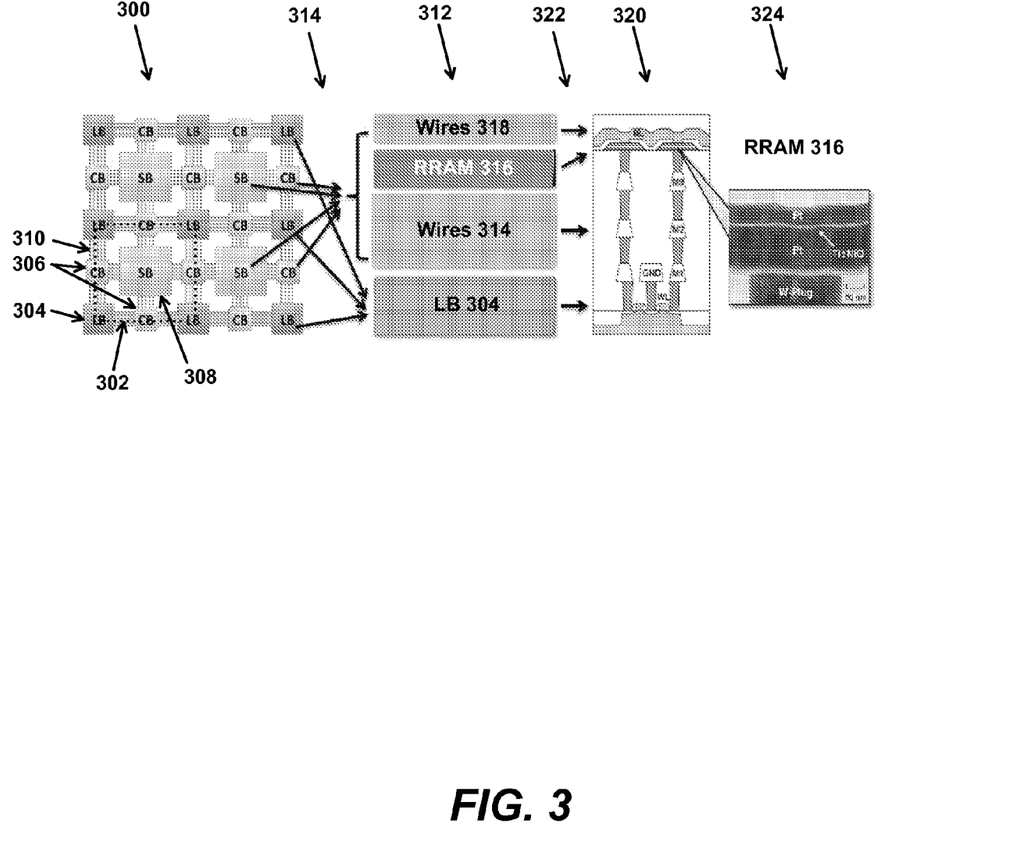
FIG. 3 is a schematic of a proposed architecture for one embodiment of present invention.

The basic schematic view of the proposed architecture with resistive memory elements is shown in FIG. 3, wherein the programmable interconnects are built up with metal wires and resistive memory elements, which are fabricated on top of logic blocks in the same die according to existing fabrication structures of resistive memory elements.

Specifically, FIG. 3 shows an FPGA 300 according to one embodiment of the present invention. The FPGA 300 is comprised of an array of tiles 302, and each tile 202 consists of one LB 304, four CBs 306 and one SB 308. (To represent the connections in FIG. 3, the single LB 304 is shown as four LBs 304 within the tile 302.) Each LB 304 contains a cluster of basic logic elements to provide customizable logic functions. The LBs 304 are connected to segmented routing channels 310 through the CBs 306, and the segmented routing channels 310 are connected with each other through the SBs 308.

The stack 312 illustrates the fabrication of the FPGA 300 on a die, according to one embodiment of the present invention. As indicated by arrows 314, the LB 304 is fabricated in the lowest layers, and the CBs 306 and SBs 308 are implemented in the upper layers on top of the lowest layers, using Wires 314, RRAM 316 and Wires 318.

The schematic 320 illustrates the implementation of the layers from the stack 312, according to one embodiment of the present invention. As indicated by arrows 322, the layers for the LBs 304, Wires 314, RRAM 316 and Wires 318 are implemented in a stacked manner in different layers of the die.

The callout 324 is a cross-sectional transmission electron microscopy (TEM) image of the structure of the RRAM 316 fabricated by a CMOS-compatible process. According to one embodiment of the present invention, the RRAM 316 is comprised of at least two Pt metal layers separated by a Ti:NiO layer, and is formed on a W-Plug.

As shown in FIG. 3, the RRAM 316 structure is a two-terminal resistance-like device, which can be fabricated between the top metal layer and the other metal layers on top of the transistor layer (i.e., LB 304) in the same die. Since no high temperature takes place during the RRAM 316 structure fabrication processes, the processes can be embedded after BEOL process and will not ruin the transistors in the LB 304 or the Wires 314 that have been fabricated below the RRAM 316 structure. It can also be seen that the RRAM 316 structure is quite simple, resulting in the easy achievement of small cell size. In spite of the simple structure, the RRAM 316 achieves the storage of one-bit data successfully.

The RRAM 316 structure can be programmed by applying a specific programming voltage or current at its two terminals to switch its resistance value at normal operation between a low resistance state (LRS) and a high resistance state (HRS). With this programmable property, the RRAM 316 acts as a programmable switch, which can be reconfigured to determine whether its two terminals are connected or not. If the two terminals need to be connected to each other, the RRAM 316 is programmed to LRS; otherwise, the RRAM 316 is programmed to HRS. This special mechanism is quite different from those of conventional memories and provides a unique opportunity to build up a new FPGA 300 routing structure with the novel use of resistive memory elements, such as RRAM 316.

Figure 4A:
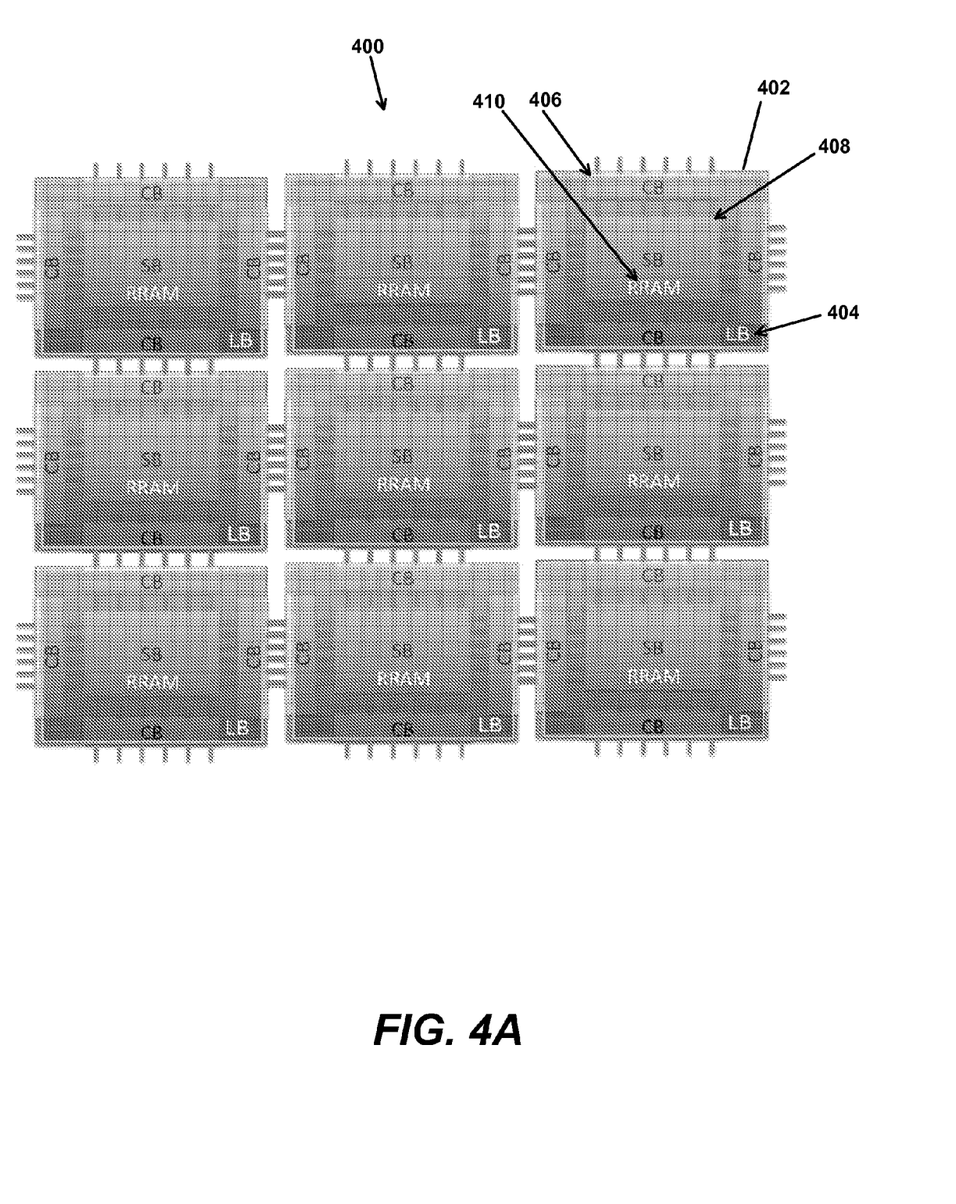
FIG. 4A provides an overview of the proposed architecture, FIG. 4B provides a detailed layout design of the connection blocks and switch blocks in the proposed architecture.

With the re-organization of LBs 304, CBs 306, SBs 308 and routing channels 310 in FIG. 3, the overall architecture of the FPGA is a highly compact array 400 of interconnected tiles 402, as shown in FIG. 4A. Specifically, FIG. 4A provides an overview of the proposed architecture where the FPGA area is contributed by the LBs 404 only, and the not CBs 406, SBs 408, or RRAMs 410. As noted in FIG. 3, the programmable routing structure of CBs 306 and SBs 308 is implemented using metal wires 314, 318 and RRAMs 316, which are fabricated in the layers above the LBs 304 in the same die. Thus, from FIG. 3 and FIG. 4A, it can be seen that the area of the proposed architecture for the FPGA 300, 400 will be reduced to the total area of the LBs 304, 404 only, which usually takes only a small portion of the conventional FPGA 300, 400 area.

Figure 4B:
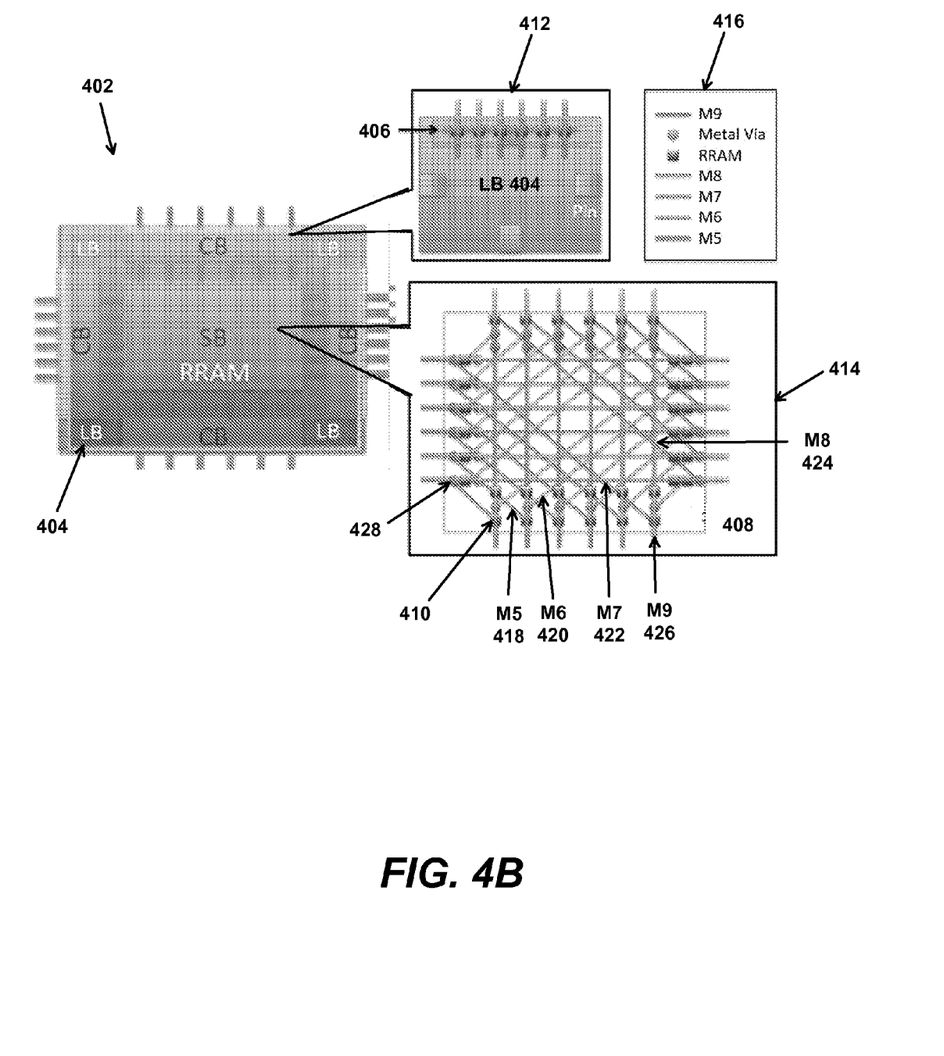

FIG. 4B is a detailed design of a single tile 402 with callouts 412 and 414 showing a top-down three-dimensional (3D) view of the implementation of the CBs 406 and SBs 408, respectively, in the proposed architecture of the FPGA 400 using the resistive memory elements, i.e., RRAMs 410 and metal wires only. Specifically, block 416 comprises a color legend for callouts 412 and 414 indicating, by color, the metal wire layers M5 418, M6 420, M7 422, M8 424, M9 426 used for the interconnects, as well as the Metal Vias 428 and the RRAMs 410.

The proposed architecture of FIG. 4B addresses some design issues as follows:

1) In this design, five metal wire layers (M5 418 to M9 426 in this example) are used solely for interconnects. The circuits of LBs 404 in the proposed architecture use the layers below these layers, e.g., M1 to M4 (not shown).

2) To ease fabrication, the layer with resistive memory elements (RRAMs 410) is designed to be located between the M9 426 and M8 424 layers. It is close to the top, as shown in the implementation structures of FIG. 3.

3) The placement of all metal wires is designed to avoid any blockage caused by a Metal Via 428. This blockage issue occurs where more than two metal layers are used, e.g., in SBs 408.

Figure 4C:
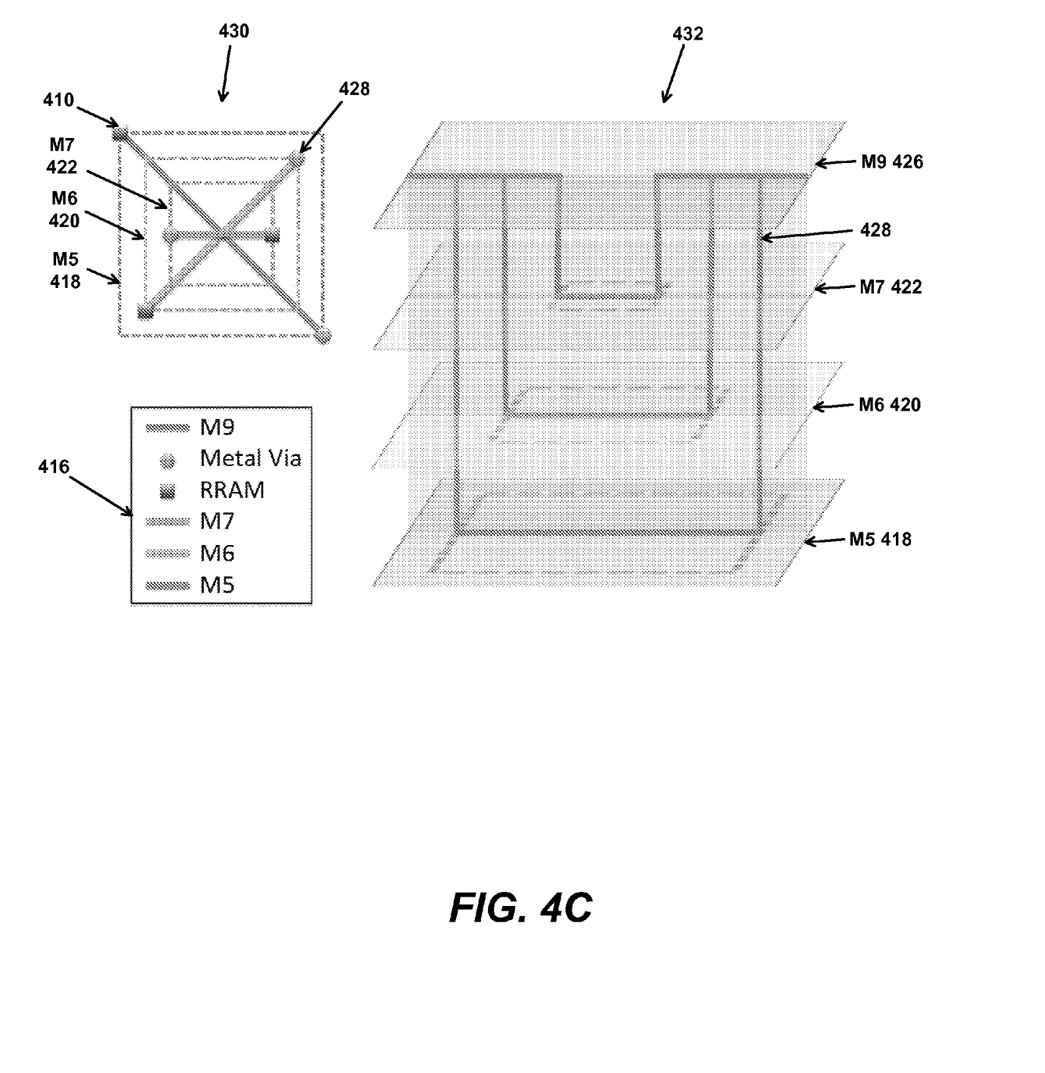
FIG. 4C illustrates in the proposed layout, how the placement of all metal wires is designed to avoid any blockage caused by a metal via, which is a common bottleneck in a stacked design.

FIG. 4C illustrates how this issue is solved in this invention, using block 416, which is the color legend indicating, by color, the metal wire layers (M5 418, M6 420, M7 422, M9 426) used for the interconnects, as well as the Metal Vias 428 and the RRAMs 410.

Consider the abstract structure 430 of a proposed SB 408 layout. (The M9 426 and M8 424 layers are omitted here for clarity.) The location of any Metal Via 428 that connects a metal layer M5 418, M6 420, M7 422, is limited to the perimeter of the rectangular box assigned to that layer.

Consider also the 3D view 432 of the proposed SB 408 layout. (The M8 424 and RRAM 410 layers are omitted here for clarity.) Metal Via 426 blockages are avoided by using vertical connections to the bottom-most metal layer M5 418 that are located at the outside of the box represented by dotted lines. This principle is repeated for the other layers M6 420 to M9 426 with decreasing box sizes represented by the dotted lines. With the application of this principle, metal wires will naturally avoid all via blockages.

4) Although the proposed design uses multiple metal layers M5 418 to M9 426, a signal rarely goes through many metal layers. While a signal is transmitted from one LB 404 to another LB 404, the straight paths in SBs 408 are used most frequently. These paths go through M8 424 and M7 422, which are close to the layer of resistive memory elements, i.e., RRAM 410, between M8 424 and M9 426, to save extra latency on the Metal Via 428.

5) Typically, resistive memory elements 410 have small cell sizes, so they can easily fit into the design in FIG. 4B without extra area overhead.

6) Each metal layer in M5 418 to M9 426 is comprised of a set of parallel metal wires without any turns. This design pattern increases regularity, reduces fabrication complexity, and avoids high resistance of turning points.

The present invention also facilitates the sharing of the programming transistors. To program the resistive memory elements integrated in the programmable interconnects, one needs to have two programming transistors at both of the terminals of one resistive memory element. Then, a resistive memory element can be correctly selected to program under control of the two programming transistors. In this invention, one resistive memory element is not allocated with two programming transistors like the 2T1M (2 transistors 1 memristor) structure in [1].

Instead, this invention allocates one programming transistor at each track in the routing channels and each pin of logic blocks. Then, any arbitrary resistive memory element is coupled between two programming transistors. When one wants to program the resistive memory element between two tracks to connect/disconnect the two tracks, he/she just needs to turn on the programming transistors at the two tracks and apply the programming voltages to them to program the resistive memory element, as shown by the interconnect schematic 500 in FIG. 5A, i.e., by programming the RRAM 502 to connect two tracks via the M6 504 layer, including a track through the Metal Via 506.

Figure 5A:
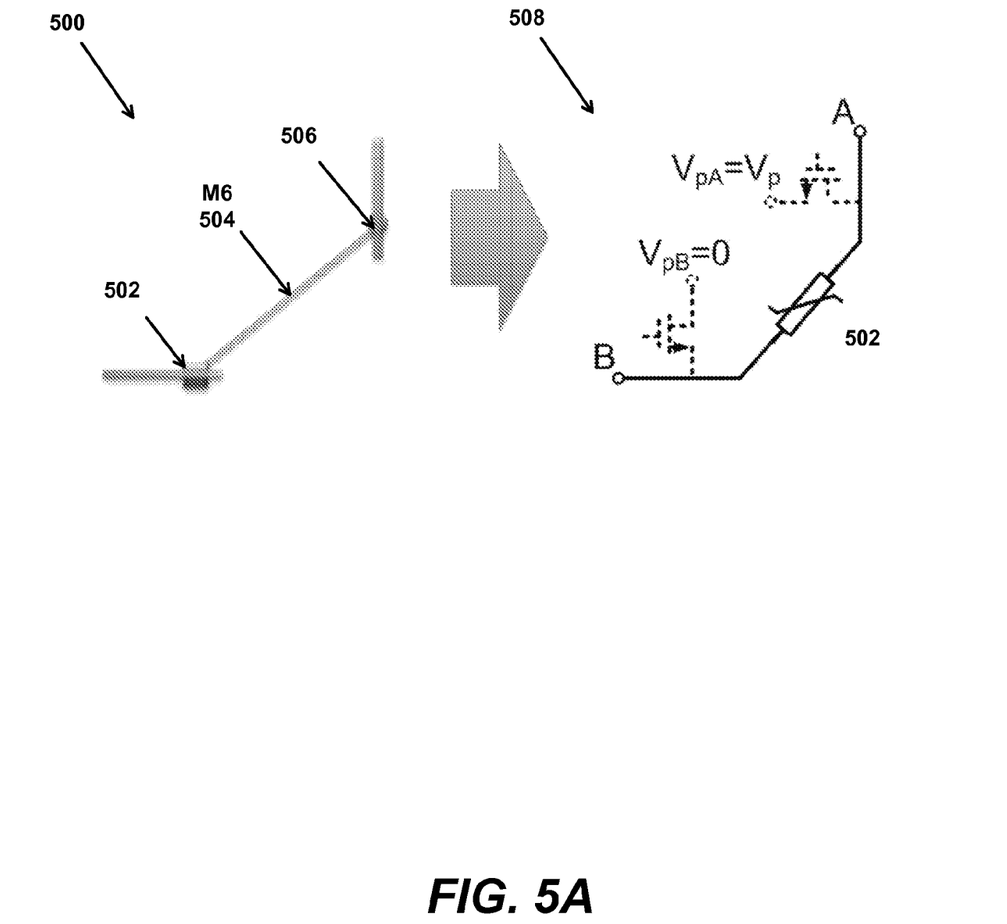
FIG. 5A illustrates how to program a resistive memory element to connect or disconnect two tracks.
Figure 5B:
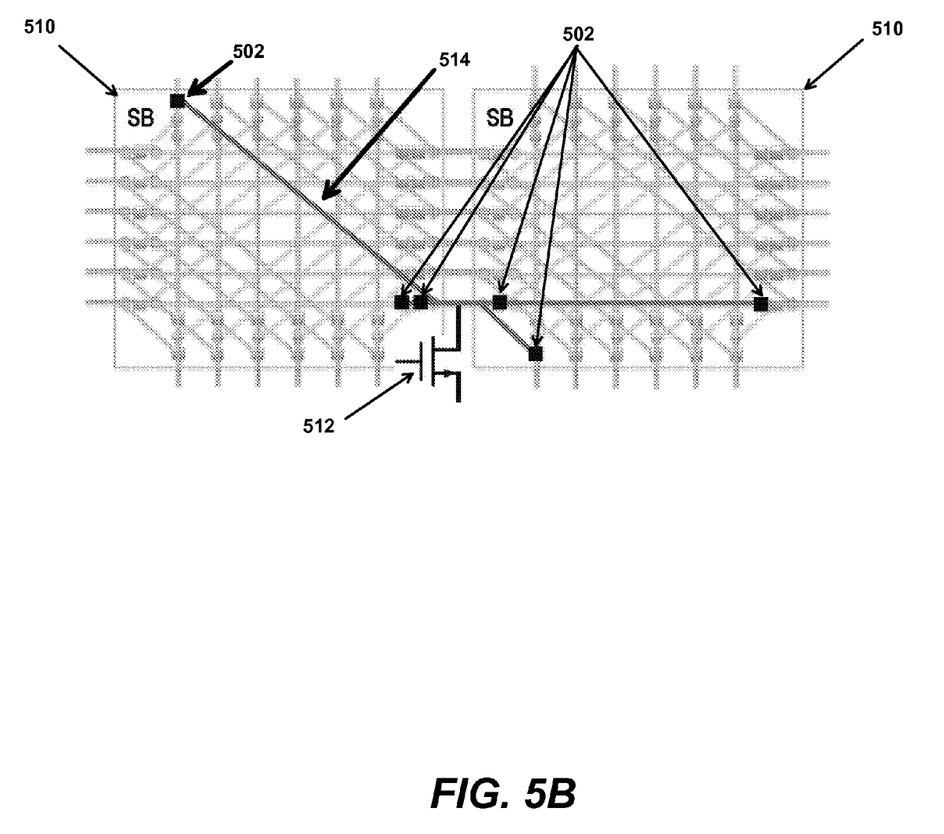
FIG. 5B illustrates in the proposed programming schematic, how one programming transistor is shared by multiple resistive memory elements through sharing paths.

FIG. 5B shows the electrical schematic 500 for FIG. 5A, wherein $V_p$ refers to the threshold voltage to switch the state of the resistive memory element RRAM 502. The programming for the resistive memory elements between the tracks and the pins of logic blocks follows a similar pattern.

On average, the total number of programming transistors in this scheme is about 1/6 of that of the 2T1M scheme. The area savings comes from the programming transistor sharing among resistive memory elements, as shown in FIG. 5B. The figure shows the situation in SBs 510, which contain more resistive memory elements RRAMs 502 than CBs (not shown). It can be observed that one programming transistor 512 is shared by as many as six resistive memory elements 502 along a Sharing Path 514, which are located not only within one single SB 510, but can also be across adjacent SBs 510 in two tiles.

Figure 6:
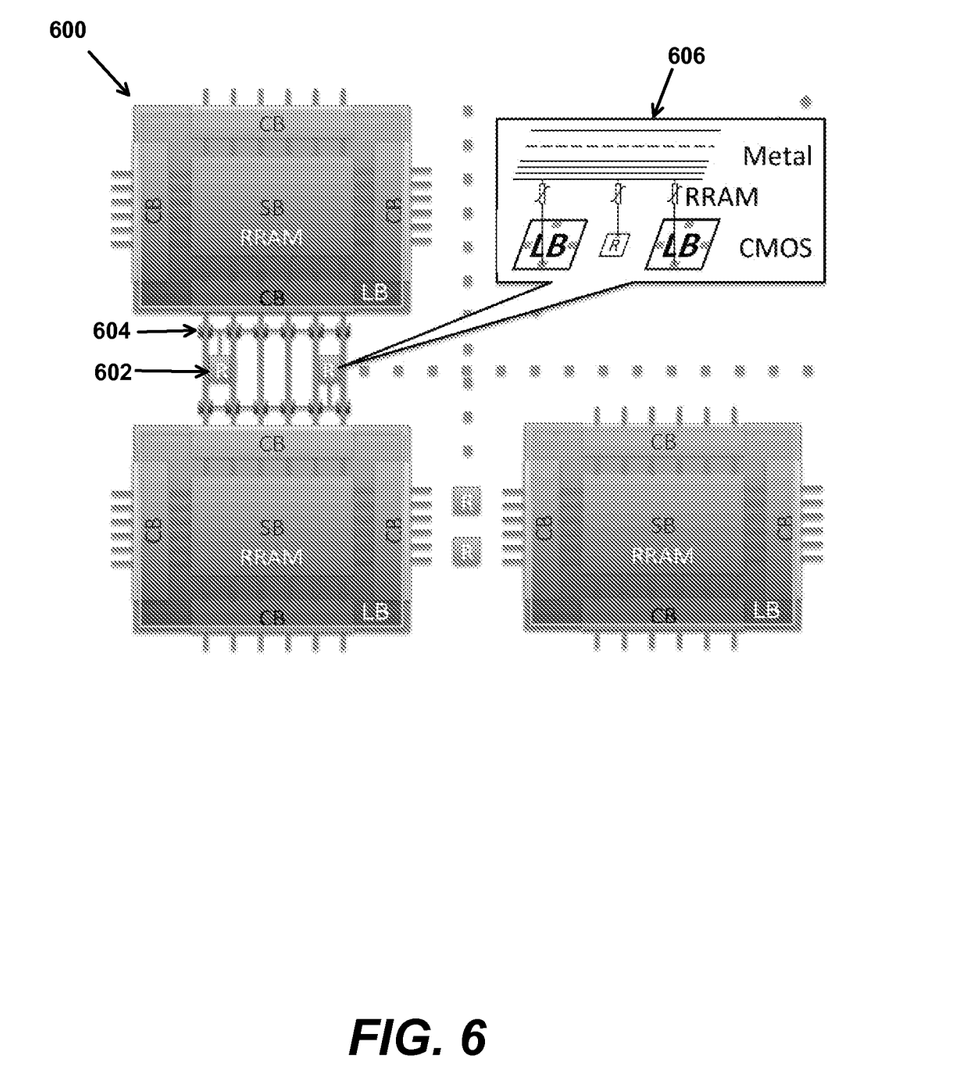
FIG. 6 provides the architecture with on-demand buffer insertion in the programmable interconnects.

The programmable interconnects in the architecture proposed above have been separated from routing buffers. Consequently, this invention also proposes on-demand buffer insertion as a buffering solution of the proposed architecture. Specifically, FIG. 6 provides an improved architecture showing single Tiles 600 with on-demand buffer (R) 602 insertion in the interconnects between the tiles 600 that is programmable via the RRAMs 604. Callout 606 shows how the LBs in the tiles 600 are interconnected with a buffer (R) 602 by means of the RRAMs 604.

Preferably, a certain number of buffers are prefabricated in routing channels and can be connected to the tracks in channels via resistive memory elements. Buffers are shared among tracks in the same channel. Only a track with a high demand for a buffer will be programmed to use a buffer. The demand depends on routing paths of the design to be implemented on the FPGA. This mechanism brings benefits of both area and performance, in that it saves unnecessary buffers in short paths and uncritical paths. The on-demand buffer insertion could be optimized by buffer placement algorithms used in ASIC design by design and therefore, the buffering solution achieves better timing than the fixed buffer pattern in a conventional FPGA.

There are two design issues for the proposed buffer architecture.

First, each buffer is now attached to routing tracks via a single resistive memory element. The regenerative feedback repeater described in [4] is needed to serve as the buffer unit. This type of repeater has one signal terminal and can provide drive in both signal directions, as opposed to conventional unidirectional buffers. It further saves buffers by serving the function of two complementary unidirectional buffers with only one repeater.

The second issue is the programming circuits for the programmable connections between buffers and routing tracks based on resistive memory elements. For a channel with M buffers, only M extra programming transistors are needed at the terminals of the M buffers with utilization of programming transistor sharing.

A limited number of buffers are prefabricated in routing channels and can be connected to the tracks in channels via RRAMs. Then, whether or not to insert one buffer at one routing node in the FPGA is optimized on demand. In contrast, in conventional FPGAs, the connections between buffers and routing tracks are predetermined during fabrication.

As shown in FIG. 6, a limited number of buffers are prefabricated in the routing channels. These buffers can be connected to the tracks in channels via RRAMs. Buffers are shared among tracks in the same channel. Only a track with a high demand for a buffer will be programmed to use a buffer. The demand depends on routing paths of the circuit to implement on the FPGA. This mechanism brings benefits of both area and performance.

REFERENCES

The following references are incorporated by reference herein:
[1] U.S. Pat. No. 7,511,532, issued Mar. 31, 2009, to Derharcobian et al., and entitled "Reconfigurable logic structures."
[2] G. S. Snider and R. S. Williams, "Nano/CMOS architectures using a field-programmable nanowire interconnect," Nanotechnology, 2007, vol. 18, no. 3, pp. 1-11.
[3] K. Tsunoda et al., "Low Power and High Speed Switching of Ti-doped NiO ReRAM under the Unipolar Voltage Source of less than 3 V," in IEDM Technical Digest, December 2007, pp. 767-770.
[4] I. Dobbelaere, M. Horowitz, and A. El Gamal, "Regenerative feedback repeaters for programmable interconnections," IEEE Journal of Solid-State Circuits, 1995, vol. 30, no. 11, pp. 1246-1253.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An electronic device having a programmable logic circuit architecture, comprising:
   a field-programmable gate array (FPGA) comprised of one or more logic blocks (LBs) that provide customizable logic functions, wherein the logic blocks are connected to routing channels through one or more connection blocks (CBs) and the routing channels are connected with each other through one or more switching blocks (SBs);
   wherein the connection blocks, routing channels, and switching blocks comprise programmable interconnects that are programmed using one or more resistive memory elements, the resistive memory elements are arranged in the same layer, and the programmable interconnects are fabricated over the logic blocks.

2. The device of claim 1, wherein the resistive memory elements comprise resistive random access memories (RRAM) or memristors.

3. The device of claim 1, wherein the resistive memory elements are CMOS-compatible resistive memory elements.

4. The device of claim 1, wherein the resistive memory elements are programmed using programming transistors that are shared among the resistive memory elements in the programmable interconnects.

5. The device of claim 1, wherein the programmable interconnects are fabricated in a layer different from the logic blocks, and the field-programmable gate array has an area that is defined by the logic blocks only.

6. The device of claim 1, wherein the field-programmable gate array includes on-demand buffer insertion in the programmable interconnects.

7. The device of claim 6, wherein positions of inserted buffers for the on-demand buffer insertion are optimized according to a design of the field-programmable gate array.

8. The device of claim 1, wherein the programmable interconnects are built up from only the resistive memory elements and metal wires, but no transistors.

9. A method for fabricating an electronic device having a programmable logic circuit architecture, comprising:
fabricating a field-programmable gate array (FPGA) comprised of one or more logic blocks (LBs) that provide customizable logic functions, wherein the logic blocks are connected to routing channels through one or more connection blocks (CBs) and the routing channels are connected with each other through one or more switching blocks (SBs);
wherein the connection blocks, routing channels, and switching blocks comprise programmable interconnects that are programmed using one or more resistive memory elements, the resistive memory elements are arranged in the same layer, and the programmable interconnects are fabricated over the logic blocks.

10. The method of claim 9, wherein the resistive memory elements comprise resistive random access memories (RRAM) or memristors.

11. The method of claim 9, wherein the resistive memory elements are CMOS-compatible resistive memory elements.

12. The method of claim 9, wherein the resistive memory elements are programmed using programming transistors that are shared among the resistive memory elements in the programmable interconnects.

13. The method of claim 9, wherein the programmable interconnects are fabricated in a layer different from the logic blocks, and the field-programmable gate array has an area that is defined by the logic blocks only.

14. The method of claim 9, wherein the field-programmable gate array includes on-demand buffer insertion in the programmable interconnects.

15. The method of claim 14, wherein positions of inserted buffers for the on-demand buffer insertion are optimized according to a design of the field-programmable gate array.

16. The method of claim 9, wherein the programmable interconnects are built up from only the resistive memory elements and metal wires, but no transistors.

* * * * *